United States Patent [19]

Davis et al.

[11] Patent Number: 5,122,200
[45] Date of Patent: Jun. 16, 1992

[54] METHOD OF CLEANING PRINTED CIRCUIT BOARDS USING FORMIC ACID

[75] Inventors: James L. Davis, Tamarac; Robert W. Pennisi, Boca Raton; Fadia Nounou; Robert J. Mulligan, both of Plantation; Bobby D. Landreth, Ft. Lauderdale, all of Fla.

[73] Assignee: Motorola, Inc., Schaumburg, Ill.

[21] Appl. No.: 583,630

[22] Filed: Sep. 17, 1990

[51] Int. Cl.$^5$ .............................................. B23K 35/34
[52] U.S. Cl. ...................................... 148/23; 148/24; 148/25
[58] Field of Search .................................... 148/23–25

[56] References Cited

U.S. PATENT DOCUMENTS

| | | | |
|---|---|---|---|
| 3,235,414 | 2/1966 | Marks | 148/23 |
| 3,796,610 | 3/1974 | Sarnacki et al. | 148/25 |
| 4,216,035 | 9/1980 | Bakos | 148/23 |
| 4,960,236 | 10/1990 | Hedges et al. | 228/180.1 |

FOREIGN PATENT DOCUMENTS 2198676  7/1988  United Kingdom .

*Primary Examiner*—Peter D. Rosenberg
*Attorney, Agent, or Firm*—Dale W. Dorinski

[57] ABSTRACT

Solder pastes having vehicles including formic acid-soluble organic acids as fluxing agents are described. Fluxing agents may be compounds of the formula:

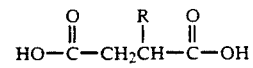

where R is an electron withdrawing group. In one embodiment, R is selected from the group consisting of fluorine, chlorine, bromine, iodine, sulfur, hydroxyl, nitrile, and benzyl. Other suitable formic-acid fluxing agents include, but are not limited to, adipic acid, acrylic acid, polyacrylic acid, methacrylic acid and polymethacrylic acid. The compounds clean oxides from the printed circuit boards (PCBs) under assembly and then volatilize leaving a residue to be cleaned away. The cleaning step involves rinsing with formic acid. No undesired residue remains indicating that the organic acids of the invention are effective in cleaning boards. Such acid fluxing agents can be used mixed with typical solder components, such as lead/tin solder pastes, or applied topically to solders, such as solder balls; both techniques permit the assembly of PCBs more easily with high quality bonds, and with little or no residue. Malic acid is a preferred organic acid fluxing agent. The formic acid cleaning step may be followed by a water rinse.

19 Claims, No Drawings

METHOD OF CLEANING PRINTED CIRCUIT BOARDS USING FORMIC ACID

CROSS-REFERENCES TO RELATED APPLICATIONS

This application is related to U.S. patent application Ser. No. 07/524,540, filed on May 17, 1990, by Davis, et al, and assigned to Motorala, Inc., which relates to solder flux formulations containing malic acid; and is related to U.S. patent application Ser. No. 07,583,129, filed on Sep. 17, 1990, by Davis et al, also assigned to Motorala, Inc. which relates to solder pastes incorporating acrylic acid and derivatives thereof to improve fluxing action and/or rheological properties.

1. Field of the Invention

The invention relates to solder paste formulations, and in one aspect, more particularly relates to solder paste formulations that produce a residue that is cleanable with formic acid.

2. Background of the Invention

Solder formulations, also known as solder creams or solder pastes, are homogeneous blends of a soft solder alloy typically in a powder form dispersed in a liquid medium conventionally containing a fluxing composition or flux, an organic solvent, and a thickening agent which will give the desired viscous or paste-like consistency to the solder formulation. Such solder formulations can be applied to the surfaces or locations in a number of various ways, such as by screen printing, or by means of a dispenser such as a syringe, or simply by dipping the site to be soldered into the solder paste formulation so that the viscous paste adheres to the site, such as an electronic component lead.

Recently, solder paste formulations have been used increasingly by the electronics industry, particularly in the automated manufacture of printed circuits in which leadless miniature electronic components are surface mounted on a printed circuit board (PCB) to which a solder paste formulation has previously been applied, such as by screen printing. The PCB is then subjected to a sufficiently high temperature, for example by means of a heated conveyor belt, to cause the flux and solder alloy in the formulation to liquefy and contact the electronic component leads so that on subsequent cooling of the PCB, the components will remain soldered on the PCB.

For some uses in the electronics industry, it is desirable to use as the flux composition of the solder formulation a material which is non-corrosive and which will provide, after the heating and cooling steps, flux residues which are themselves non-corrosive and non-conducting. For this reason, rosin-based flux compositions are widely used in the commercially available solder paste formulations specifically made for use in the manufacture of surface mounted electronic components.

Alternatively, more reactive fluxing compositions may be used, which leave residues which are corrosive and/or conductive. Often a somewhat corrosive fluxing composition is desired so that the oxides which form on the metal surfaces to be soldered may be removed to permit the subsequently formed solder bond to be stronger both physically and electrically. Corrosive fluxing compositions usually leave residues and it is necessary to remove these residues formed by means of either aqueous or organic solvent systems to ensure that the resulting soldered circuit is non-corrosive.

The use of solder paste formulations containing such rosin-based or more reactive fluxes has a number of disadvantages. First, because the non-corrosive residues (such as rosins) tend to be sticky, they prevent repetitive automatic testing of the circuit. Rosin-based fluxes tend to leave copious amounts of residue on the circuit. Additionally, such residues are unsightly and therefor, as with the corrosive flux residues which are also unattractive, will need to be removed. The removal step involves extra production equipment, time and material.

Secondly, flux residues tend to be hygroscopic and may thereby cause spattering. Thirdly, some fluxes permit solder particles in the paste to move away from the solder site and give rise to the formation of numbers of discrete small balls of soft solder around the soldered joints, which can create electrical short circuits.

Because of these and other disadvantages, it is desirable and often essential to meet specifications, to remove the flux residues and any solder balls as much as possible. Often, however, their removal is difficult or impossible, particularly from areas of the PCB underneath the electronic components.

As noted, a common procedure is to use an aqueous or organic solvent in the removal of flux residues. Though water is preferred because it will not leave an objectionable residue itself, water typically is an ineffective agent, since many of the residues, such as the rosin residues, are only slightly soluble in water. Organic solvents are more effective, but less desirable because they are more expensive and particularly because they are more troublesome to dispose of. A particular class of organic solvents that had attained widespread use was the halocarbons, such as the chlorofluorocarbons (CFCs), because they would volatilize after cleaning. However, these materials are particularly inert and their eventual decomposition is involved in the undesirable depletion of atmospheric ozone. The solder paste formulations of the present invention do not require and do not contain CFCs for residue removal.

Thus, for these and other reasons the prior solder fluxing compositions are less preferred, and it would therefore be advantageous to discover a new fluxing composition that would avoid one or more of these disadvantages. For example, it would be advantageous to provide solder pastes whose residues could be easily cleanable by a relatively inexpensive organic solvent that is readily disposed of, such as formic acid.

SUMMARY OF THE INVENTION

Accordingly, it is an object of the present invention to provide a solder fluxing composition that would provide an oxide removing agent during the soldering process.

It is another object of the present invention to provide a novel fluxing agent which is an oxide removing agent that would either readily volatilize or be readily removed.

It is yet another object of the invention to provide a fluxing composition that would accomplish the above objectives, but also be easy to formulate.

In carrying out these and other objects of the invention, there is provided, in one form, a method of mounting electronic components on a printed circuit board providing a residue cleanable with formic acid which involves first formulating a solder paste by mixing together a solder paste vehicle having a solvent and a fluxing agent selected from the group consisting of organic acids soluble in formic acid; and a solder powder comprising a metal selected from the group consisting of lead, tin, antimony, silver and mixtures thereof. Next, the solder paste is applied to a metallic surface to be soldered. At least one electronic component is placed on the metallic surface to be soldered. Then the solder paste is caused to reflow and form a solder bond producing a residue on the metallic surface. Finally, the residue is removed by washing the surface with formic acid.

DETAILED DESCRIPTION OF THE INVENTION

It has been discovered that formic acid is an inexpensive, readily available and readily disposable solvent for washing away certain residues left from a solder reflow operation, such as the assembling of electronic components to a printed circuit board (PCB). Typically, an organic acid is used in the solder paste, or is topically applied to the solder bond to serve as an effective fluxing agent by removing the oxides from the metallic surfaces to which the component is to be bonded. The organic acid should be soluble in formic acid so that the formic acid may wash away the residue after the bonding step.

Suitable organic acid materials that are soluble in formic acid include compounds of the formula:

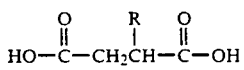

where R is an electron withdrawing group, which added as the sole or joint fluxing agent to solder pastes is an effective flux for the soldering of solders such as tin/lead, tin/lead/silver and tin/lead/silver/antimony to metals such as copper, aluminum, etc. In one aspect, the R group may be fluorine, chlorine, bromine, iodine, sulfur, nitrile, hydroxyl, benzyl or some other electron withdrawing group. Phrased another way, R must be electronegative, although there is no specific degree of electronegativity required.

Other suitable organic formic acid-soluble fluxing agents include, but are not limited to, adipic acid, acrylic acid, polyacrylic acid, methacrylic acid and polymethacrylic acid. These excellent fluxing compositions produce substantially less residue than conventional fluxing agents based on rosin chemistry, and in some cases produce no residue at all. Where residue is present, however, it may be easily and quickly removed with formic acid.

In one aspect of the invention where R is hydroxyl, the formula above represents malic acid, HOOCCH$_2$CH(OH)COOH. As will be explained, malic acid was unexpectedly found to perform surprisingly better than some of the other organic acids screened. It has also been discovered that there are a number of ways to implement this concept.

More specifically, these formic acid-soluble organic acids have been found to serve as good fluxing agents for soldering Sn/Pb; Sn/Pb/Ag and Sn/Pb/Ag/Sb compositions to copper over and above some of the other organic acids. It will be appreciated, however, that other solders are expected to be useful in conjunction with malic acid, and that other metals besides copper are expected to be effectively cleaned and bonded to by formulations containing malic acid. The flux can be prepared in a variety of ways, including, but not limited to:

(1) The addition of organic acid powder to a solder paste vehicle.
(2) A solution of the formic acid-soluble acid in a number of solvents, including, but not limited to alcohols such as isopropanol and Cellosolve ™ derivatives.
(3) Applying the organic acid topically in powder form or dissolved in a solvent to solder structures, such as spheres.

With these solder formulations, tests have shown that these organic acids are effective fluxing agents, resulting in solder reflow bonds having minimum residue, which can be easily removed by the recited organic acids. The addition of the organic acids to the paste vehicle is straightforward since these materials are solid powders at room temperature.

The fluxing action of organic acids appears to be derived from the ability of the acid to reduce surface oxides. Interestingly, malic acid can also be used directly or topically as a flux for solder balls or spheres.

The solder used in this process can be untreated solder powder (as in a paste formulation) or solder spheres. The metals of the solder may include, but are not limited to, lead, tin, antimony, silver and mixtures thereof. These types of solders were found to exhibit excellent reflow characteristics. In just one example, the solder powder of the solder paste of this invention may range from about 85 to about 92 wt. %, in one aspect only.

In the instances where malic acid is used in conjunction with a solvent to provide a vehicle for a solder formulation, in one aspect the proportion of malic acid in the vehicle ranges from about 0.1 to about 60 wt. % of the vehicle, and in a preferred aspect from about 0.3 to about 40 wt. % of the vehicle. In another aspect, the solder paste may have from about 2 to about 5 wt. % organic acid fluxing agent, based on the total solder paste.

It will be appreciated that the proportion of organic acid as a proportion of the solder paste vehicle will vary depending on the particular formulation. For example, high temperature solder pastes or pastes for highly oxidized metal surfaces may require a different organic acid proportion to those outlined above. The balance of the fluxing composition may be any of the customary materials. It will be appreciated that although the other common materials, such as the rosins, may be used in conjunction with the compounds of the invention, that some of these typical materials contribute to flux residues and should not be employed to take full advantage of the little or no residues provided by the flux compositions of the present invention.

Suitable alcoholic solvents for dissolving the malic acid include, but are not limited to isopropanol; 2-butanol; 1-hexanol; 1-heptanol; 1-octanol; 1-dodecanol; 2-ethoxyethanol; 2-(2-ethoxyethoxy)ethanol; 2-(2-butoxyethoxy) ethanol; n-hexadecanol; n-octadecanol; benzyl alcohol; 1,2-ethanediol; 1,2-propanediol; 1,3-propanediol; 1,2-butanediol; 1,3-butanediol; 1,4-butanediol; 1,2-pentanediol; 1,5-pentanediol; 2,4-pentanediol; 2,5-hexanediol; glycerol; 1,2,4-butanetriol; 2,2'-(ethylenedioxy)diethanol; 1,12-dodecanediol; 1,16-hexadecanediol and mixtures thereof. In one embodiment of this invention, and as an example only, the solder paste may have from about 6 to about 8 wt. % solvent.

The solder pastes of this invention may optionally contain paraformaldehyde as a blowing agent and formic acid generator, in amounts up to about 3%.

The proposed solder pastes containing a formic acid-soluble organic acid fluxing agent can replace current solder fluxing systems based on rosin additives. For example, malic acid can replace the acid in conventional abietic acid-based fluxes. The addition of malic acid to the solder pastes will achieve excellent solder reflow properties and reduce the residue problems that plague conventional solder pastes. This formic acid-soluble residue eliminates the need for any board cleaning with ozone-depleting CFCs after solder reflow.

With any of these organic acid fluxes and methods of this invention, no retooling would be required in the existing assembly line. The residue that does remain with these systems may be washed away with formic acid. Depending on the exact organic fragments from the non-metallic compounds, the formic acid to rinse them will probably need to be treated as well prior to disposal. Nevertheless, these concerns are appreciably less than those presented by the CFC cleaning agents.

The invention will be described in more detail with respect to the following illustrative examples.

EXAMPLES 1-15

Various organic acids were added, in quantities ranging from about 10 to about 100 mg., to an aluminum pan containing 10 to 15 30 mil diameter solder spheres. A couple of drops of isopropyl alcohol (IPA) were also added to the pans. The pans were heated on a hot plate to temperatures above the melting point of the tin/lead solder spheres. Whether or not the solder balls coalesced was observed. Coalescence is a measure of whether reflowing of the solder and wetting of the pan occurred. The following organic acids were evaluated.

TABLE I

Organic Acid Screening

| Example | Acid | Solder ball coalescence occurred? |
|---|---|---|
| 1 | Abietic acid | Yes |
| 2 | Adipic acid | Yes |
| 3 | Ascorbic acid | Yes |
| 4 | Acrylic acid | Yes |
| 5 | Citric acid | Yes |
| 6 | 2-Furoic acid | Yes |
| 7 | Malic acid | Yes |
| 8 | Polyacrylic acid (av. mol. wt. = 2000) | Yes |
| 9 | Acetic acid | No |
| 10 | Cyclohexane carboxylic acid | No |
| 11 | Formic acid | No |
| 12 | Hexanoic acid | No |
| 13 | 4-Hydroxybutyric acid/Na salt | No |
| 14 | Maleic acid | No |
| 15 | Oxalic acid | No |

EXAMPLE 16

Malic Acid Solder Paste Formulation

A solder paste was formulated with the following composition:

| 89.8% | 2.0192 g | Solder powder: 63% Sn/36.65% Pb/ 0.35% Sb |
|---|---|---|
| 0.4% | 0.0091 g | Malic Acid (Aldrich Chemical Co., 99%) |
| 0.3% | 0.0074 g | Adipic Acid (Aldrich, >99%) |
| 1.4% | 0.0319 g | Paraformaldehyde (Aldrich, 95%) |
| 4.0% | 0.0902 g | Isopropanol (IPA, Fischer Chemical Co. >99.9%) |
| 4.0% | 0.0900 g | 2-(2-Ethoxyethoxy) ethanol |

The solder paste was placed in copper plated pan and heated until reflow occurred (190°-250° C.). A light brown residue formed after reflow which was not soluble in water as observed in Example 17. Addition of one drop of concentrated formic acid (88%, Fisher Scientific) to the paste mixture in the pan prior to reflow did not result in the degree of wetting that was observed for the initial paste. However, a second drop of formic acid was added to the paste at 250° C. This resulted in removal of all visible residue.

EXAMPLE 17

Malic Acid Solder Paste

A very low residue solder paste was formulated with the following composition.

| 87.0% | Solder powder |
|---|---|
| 1.0% | Paraformaldehyde (Aldrich, 95%) |
| 3.0% | Malic acid (Aldrich, 99%) |
| 9.0% | 1-Dodecanol (Aldrich, 98%) |

The solder paste was placed in copper plated pans and reflowed. Temperatures were measured by a surface thermometer and thus may have read lower than the actual temperature of the pan.

Run 1—The solder paste reflowed at 200° C. and the pan was removed from the heat source. A milky residue was observed in the pan after reflow of the solder balls. The pan was dipped in HCOOH (concentrated formic acid) for 10 seconds followed by a water rinse. The residue was not visible after the formic acid dip.

Run 2—The balls reflowed at 200° C. on copper/Kapton flex tape from 3M. Large amounts of residue were observed. Auger spectroscopy (35 minutes) was used to analyze the residue. Then the solder was dipped in concentrated HCOOH for one minute, followed by a water rinse for one minute. No residue was visible after the cleaning treatment. The spectroscopy conducted before the wash revealed the presence of carbon, oxygen, chlorine, sulfur, tin and lead. Auger spectroscopy of the pan after washing determined the remaining presence of carbon, oxygen, sulfur, lead, chlorine and sulfur at reduced concentrations.

EXAMPLE 18

Malic Acid Solder Paste

A low residue, formic acid cleanable solder paste was formulated with the following composition.

| 88.0% | Solder powder |
|---|---|
| 4.0% | Malic acid (Aldrich, 99%) |
| 1.0% | EDTA |
| 1.0% | Polyacrylic acid |
| 5.0% | 1-Dodecanol |
| ~2.0% | 2-(2-Ethoxyethoxy)ethanol - Added |

This paste was tested in a manner similar to that of Example 17. Again, solvent bleed-out occurred prior to reflow. Formic acid eliminated virtually all residue.

It is apparent that the use of the compounds of this invention provide useful fluxing agents in solder paste vehicles. Malic acid is an especially useful organic acid fluxing agent that performs surprisingly better than other acids, particularly in leaving low portions of residue. Additional embodiments of the invention include (1) topical application of the organic acid fluxing agents to solder bonds, later cleaned away with organic acids, (2) soldering and assembling in a formic acid/nitrogen atmosphere, and (3) generating formic acid in situ at soldering temperatures by chemical or photochemical reactions. The discovery of a solder paste with formic acid soluble residues is significant because it will eliminate the use of CFCs in printed circuit board cleaning. With respect to alternate embodiment (2) above, Seitz & Hohnerlein GMBH (SEHO) markets a formic acid/nitrogen atmosphere reflow oven, although no known pastes specifically designed for use in formic acid environments have been developed, until now.

It will be appreciated that modifications may be made in the exact implementation of the invention illustrated in the above examples which would still fall within the spirit and scope of the invention as claimed herein. For example, it is anticipated that the processing conditions, modes or sequences of addition of the vehicles and fluxing compositions, and exact combinations of flux components may be altered to optimize the invention by one skilled in the art. It is also expected that the method of this invention could be used to facilitate assembly of PCBs by having solder paste containing the formic-acid soluble organic acid fluxing agents screened thereon.

We claim:

1. A method of mounting electronic components on a printed circuit board providing a residue cleanable with formic acid comprising the steps of:
    formulating a solder paste by mixing together:
        a solder paste vehicle comprising:
            a solvent; and
            a fluxing agent selected from the group consisting of organic acids soluble in formic acid; and
        a solder powder comprising a metal selected from the group consisting of lead, tin, antimony, silver and mixtures thereof;
    applying the solder paste to a metallic surface to be soldered;
    placing at least one electronic component on the metallic surface to be soldered;
    causing the solder paste to flow and form a solder bond producing a residue on the metallic surface; and
    removing the residue by washing the surface with formic acid.

2. The method of claim 1 where the fluxing agent is selected from the group consisting of an organic acid having the formula:

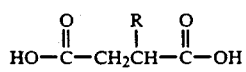

where R is an electron withdrawing group, and adipic acid, acrylic acid, polyacrylic acid and mixtures thereof.

3. The method of claim 2 where R is selected from the group consisting of fluorine, chlorine, bromine, iodine, sulfur, hydroxyl, nitrile, and benzyl.

4. The method of claim 1 where the proportion of the organic acid in the vehicle ranges from about 0.1 to about 60 wt. % of the vehicle.

5. The method of claim 1 where the solvent is an alcohol.

6. The method of claim 1 where the organic acid fluxing agent is malic acid.

7. The method of claim 1 where the solder paste comprises the following formulation:
    about 6 to about 8 wt. % solvent;
    about 2 to about 5 wt. % organic acid fluxing agent; and
    about 85 to about 92 wt. % solder powder.

8. The method of claim 7 where there is also present up to about 3 wt. % paraformaldehyde.

9. A method of mounting electronic components on a printed circuit board providing a residue cleanable with formic acid comprising the steps of:
    formulating a solder paste by mixing together:
        a solder paste vehicle comprising:
            a solvent; and
            a fluxing agent selected from the group consisting of an organic acid having the formula:

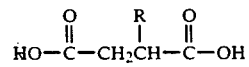

where R is an electron withdrawing group, and adipic acid, acrylic acid, polyacrylic acid and mixtures thereof, and where the proportion of the organic acid in the vehicle ranges from about 0.1 to about 60 wt. % of the vehicle; and
        a solder powder comprising a metal selected from the group consisting of lead, tin, antimony, silver and mixtures thereof;
    applying the solder paste to a metallic surface to be soldered;
    placing at least one electronic component on the metallic surface to be soldered;
    causing the solder paste to flow and form a solder bond producing a residue on the metallic surface; and
    removing the residue by washing the surface with formic acid.

10. The method of claim 9 where R is selected from the group consisting of fluorine, chlorine, bromine, iodine, sulfur, hydroxyl, nitrile, and benzyl.

11. The method of claim 9 where the solvent is an alcohol.

12. The method of claim 9 where the organic acid fluxing agent is malic acid.

13. The method of claim 9 where the solder paste comprises the following formulation:
    about 6 to about 8 wt. % solvent;
    about 2 to about 5 wt. % organic acid fluxing agent; and
    about 85 to about 92 wt. % solder powder.

14. The method of claim 13 where there is also present up to about 3 wt. % paraformaldehyde.

15. A method of mounting electronic components on a printed circuit board providing a residue cleanable with formic acid comprising the steps of:
    formulating a solder paste by mixing together:
        a solder paste vehicle comprising:
            a solvent; and
            a fluxing agent selected from the group consisting of an organic acid having the formula:

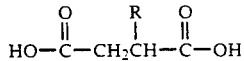

where R is an electron withdrawing group, and adipic acid, acrylic acid, polyacrylic acid and mixtures thereof, and where the proportion of the organic acid in the vehicle ranges from about 0.1 to about 60 wt. % of the vehicle; and a solder powder comprising a metal selected from the group consisting of lead, tin, antimony, silver and mixtures thereof;

where the solder paste comprises the following formulation:

about 6 to about 8 wt. % solvent;

about 2 to about 5 wt. % organic acid fluxing agent;

about 85 to about 92 wt. % solder powder;

about 0 to about 3 wt. % paraformadehyde;

applying the solder paste to a metallic surface to be soldered;

placing at least one electronic component on the metallic surface to be soldered;

causing the solder paste to flow and form a solder bond producing a residue on the metallic surface; and removing the residue by washing the surface with formic acid.

16. The method of claim 15 where R is selected from the group consisting of fluorine, chlorine, bromine, iodine, sulfur, hydroxyl, nitrile, and benzyl.

17. The method of claim 15 where the solvent is an alcohol.

18. The method of claim 15 where the organic acid fluxing agent is malic acid.

19. A method of mounting electronic components on a printed circuit board providing a residue cleanable with formic acid comprising the steps of:

formulating a solder comprising a solder powder comprising a metal selected from the group consisting of lead, tin, antimony, silver and mixtures thereof soldering at least one electronic component on a metallic surface by means of solder bonds;

causing the solder paste to flow and form a solder bond;

topically applying a fluxing agent selected from the group consisting of organic acids soluble in formic acid to the solder bond which produces a residue on the metallic surface; and removing the residue by washing the surface with formic acid.

* * * * *